United States Patent
Shim et al.

(10) Patent No.: US 7,056,838 B2
(45) Date of Patent: Jun. 6, 2006

(54) FABRICATION METHOD FOR ORGANIC SEMICONDUCTOR TRANSISTOR HAVING ORGANIC POLYMERIC GATE INSULATING LAYER

(76) Inventors: Jae Hoon Shim, 324-10, Seokyo-dong, Mapo-ku, Seoul 121-836 (KR); Sung Min Kim, 102, 392-27 Hwagok-8-dong, Kangseo-ku, Seoul 157-886 (KR); Bong Ok Kim, 101-801, Ilsung Park Apartment, 99 Kunja-dong, Kwangjin-ku, Seoul 143-839 (KR); No Gil Park, 202, 1-63 Sinsa-dong, Eunpyung-ku, Seoul 122-080 (KR); Mi Young Kwak, 6-304, Jinheung Apartment, 65 Cheongdam-1-dong, Kangnam-ku, Seoul 135-953 (KR); Young Kwan Kim, 122-104, Jinheung Apartment, 97-3 Anyang-dong, Manan-ku, Anyang, Kyungki-do 430-010 (KR)

( * ) Notice: Subject to any disclaimer, the term of this patent is extended or adjusted under 35 U.S.C. 154(b) by 0 days.

(21) Appl. No.: 11/197,090

(22) Filed: Aug. 4, 2005

(65) Prior Publication Data

US 2005/0266629 A1    Dec. 1, 2005

Related U.S. Application Data

(62) Division of application No. 10/487,581, filed as application No. PCT/KR01/01436 on Aug. 24, 2001.

(51) Int. Cl.
    *H01L 21/31* (2006.01)
(52) U.S. Cl. ...................................... 438/780
(58) Field of Classification Search .................. 438/99, 438/780
    See application file for complete search history.

(56) References Cited

FOREIGN PATENT DOCUMENTS

KR    1993-0001358    *  1/1993

OTHER PUBLICATIONS

U.S. Appl. No. 10/487,581.*

* cited by examiner

*Primary Examiner*—Michael Lebentritt
*Assistant Examiner*—Scott Geyer
(74) *Attorney, Agent, or Firm*—Cantor Colburn LLP

(57) ABSTRACT

Provided is a method for fabricating an organic semiconductor transistor having an organic polymeric gate insulating layer. The method includes forming an organic gate insulating layer on a substrate by a vapor deposition method using organic monomer sources, and causing a polymerization reaction to occur in the organic gate insulating layer to complete an organic polymeric gate insulating layer. Since the vapor deposition method, which is a low-temperature dry-type technique, is employed, the organic polymeric gate insulating layer can be uniformly formed on a large-area substrate by a simplified in-situ process.

12 Claims, 4 Drawing Sheets

FABRICATION METHOD FOR ORGANIC SEMICONDUCTOR TRANSISTOR HAVING ORGANIC POLYMERIC GATE INSULATING LAYER

CROSS-REFERENCE TO RELATED APPLICATIONS

This application is a divisional application of U.S. patent application Ser. No. 10/487,581, filed on Feb. 23, 2004, which is the national stage application of and claiming benefit of International Patent Application No. PCT/KR01/01436 filed Aug. 24, 2001 designating the United States of America, of which both applications are herein incorporated by reference in their entirety.

TECHNICAL FIELD

The present invention relates to a fabrication method for a transistor, and more particularly, to a fabrication method for an organic semiconductor transistor having an organic polymeric gate insulating layer.

BACKGROUND ART

In order for a material to be used as a gate insulating layer in an organic semiconductor transistor, the material must have a low electrical conductivity and a high breakdown field characteristic. Thus, an inorganic insulating layer, such as silicon oxide, having an electrical conductivity of less than $10^{-12}$ S/cm and a breakdown field of greater than 1 MV/cm, is widely used as a gate insulating layer.

However, inorganic insulating layers, which are formed at high temperature, may affect other layer materials previously formed on a substrate through preceding processes (to be called as pre-process layers hereinafter).

On the other hand, organic insulating layers, which are formed at low temperature, do not affect pre-process layers. Thus, research into organic insulating layers as new gate insulating layers is being vigorously conducted.

Known methods for fabricating organic insulating layers include a spin coating method and a monomolecular layer formation method using the Langmuir-Blodgett film process, which are both advantageously simplified, low-temperature techniques.

However, these techniques are effective only when they are applied to a small-area substrate. As flat-panel displays tend to increase in area, these techniques are difficult to be applied thereto. Further, since these techniques are wet-type processes, a pre-process layer may be dissolved during the processes, limiting selection of the kind of the pre-process layer. Thus, it is quite difficult to design an organic semiconductor transistor in various manners. Since the process for forming organic insulating layers is not in-situ performed with respect to the pre- or post-processes, the fabrication process and equipment become complex, resulting in an increase in the fabrication cost.

Therefore, there is an increasing demand for methods for fabricating an organic gate insulating layer on a large-area substrate with a simplified process.

DISCLOSURE OF THE INVENTION

It is an object of the present invention to provide a fabrication method of an organic semiconductor transistor having an organic gate insulating layer by a low-temperature, dry-type process.

To accomplish the above object of the present invention, there is provided a method for fabricating an organic semiconductor transistor, the method including forming a gate insulating layer using an organic polymeric layer by vapor deposition which is a low-temperature, dry-type technique. First, a substrate is provided, and an organic gate insulating layer is formed on the substrate by a vapor deposition method using organic monomer sources. Then, a polymerization reaction is caused to occur in the organic gate insulating layer to complete an organic polymeric gate insulating layer.

Here, the organic gate insulating layer is preferably formed to a thickness of 50 to 20000 Å.

Also, the vapor deposition method is preferably a vacuum deposition method.

The polymerization reaction is preferably thermal polymerization performed by a heat treatment at 100 to 400° C. or photo-polymerization by light radiation of 150 nm to 10 µm.

The steps of forming the organic gate insualting layer and completing the organic polymeric gate insulating layer using the thermal polymerization are preferably in-situ performed.

The method may further include the step of forming an organic semiconductor active layer on the organic polymeric insulating layer, after the step of completing the organic polymeric insulating layer, and the steps of forming the organic gate insualting layer, completing the organic polymeric gate insulating layer and forming an organic semiconductor active layer on the organic polymeric insulating layer are preferably in-situ performed.

In step of providing a substrate, an organic semiconductor active layer and a source/drain electrode are preferably formed on the substrate. The organic semiconductor active layer and the source/drain electrode are preferably formed by the step in-situ performed with respect to the steps of forming the organic gate insualting layer and completing the organic polymeric gate insulating layer.

In the case where the organic polymeric gate insulating layer is a polyimide layer, the organic monomer source may include an aromatic tetracarboxylic dianhydride monomer and an aromatic diamine monomer, and the organic polymeric gate insulating layer is a gate insulating layer. In this case, the step of forming the organic gate insulating layer may include separately evaporating the aromatic tetracarboxylic dianhydride monomer and the aromatic diamine monomer so that the molar ratio of the respective monomers in the organic gate insulating layer becomes 1:1.

The steps of forming the source/drain electrode and the gate electrode of the organic semiconductor transistor are preferably in-situ performed with respect to the steps of forming the organic gate insulating layer and completing the organic polymeric gate insulating layer.

BRIEF DESCRIPTION OF THE DRAWINGS

The above object and advantages of the present invention will become more apparent by describing in detail a preferred embodiment thereof with reference to the attached drawings in which.

BEST MODE FOR CARRYING OUT THE INVENTION

Figure 1:
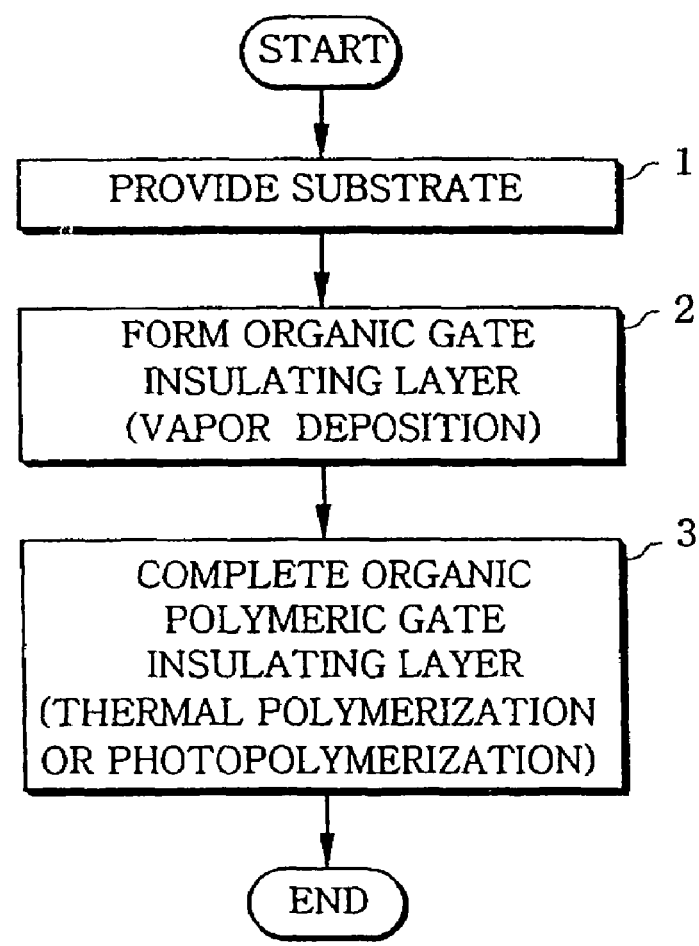
FIG. 1 is a representation of a method for forming an organic polymeric gate insulating layer in a fabrication method of an organic semiconductor transistor according to the present invention.

A method for fabricating an organic semiconductor transistor according to the present invention will now be described in detail. However, the present invention is not limited to the following embodiments and is implemented in various forms. Rather, these embodiments are provided only so that this disclosure will be thorough and complete and will fully convey the scope of the invention to those who have ordinary skills in the art. Throughout the drawings, organic TFTs are schematically drawn and thicknesses of various films are exaggerated for clarity. In the drawings, the same elements are designated by the same numbers.

In the method for fabricating an organic semiconductor transistor according to the present invention, a gate insulating layer is formed of an organic polymeric layer. A process for forming an organic polymeric gate insulating layer is shown in FIG. 1.

Referring to FIG. 1, a substrate is provided to form a gate insulating layer (step 1). The substrate is used to form a transistor and may take any form of a silicon substrate, a glass substrate or a plastic substrate. Also, a refractory plastic substrate having a high glass transition temperature can be used as a substrate for an organic semiconductor transistor. A large-area substrate of 8 inches or greater can also be used as a substrate for a flat-panel display. A preceding process layer is formed on a substrate according to the kind of a transistor. For example, in the case of forming a staggered-inverted type organic TFT, a gate electrode may be formed on the substrate. In the case of forming a staggered type organic TFT, an active layer and a stacked layer structure of source/drain electrodes may be formed on the substrate.

In detail, the substrate is first loaded into a vapor deposition apparatus. Usable vapor deposition apparatuses include a vacuum deposition apparatus.

Then, at least one organic monomer source is inserted into an evaporator of the vapor deposition apparatus. In the case of forming a polyimide layer as an organic polymeric gate insulating layer, it is preferred that two kinds of sources are simultaneously used. A first source is an aromatic tetracarboxylic dianhydride monomer source. Usable examples of the first source include oxydiphthalic anhydride (ODPA), pyromellitic dianhydride (PMDA), benzophenone tetracarboxylic dianhydride (BTDA) and biphthalic dianhydride (BPDA). A second source is an aromatic diamine monomer source. Usable examples of the second source include materials represented by the following formula 1:

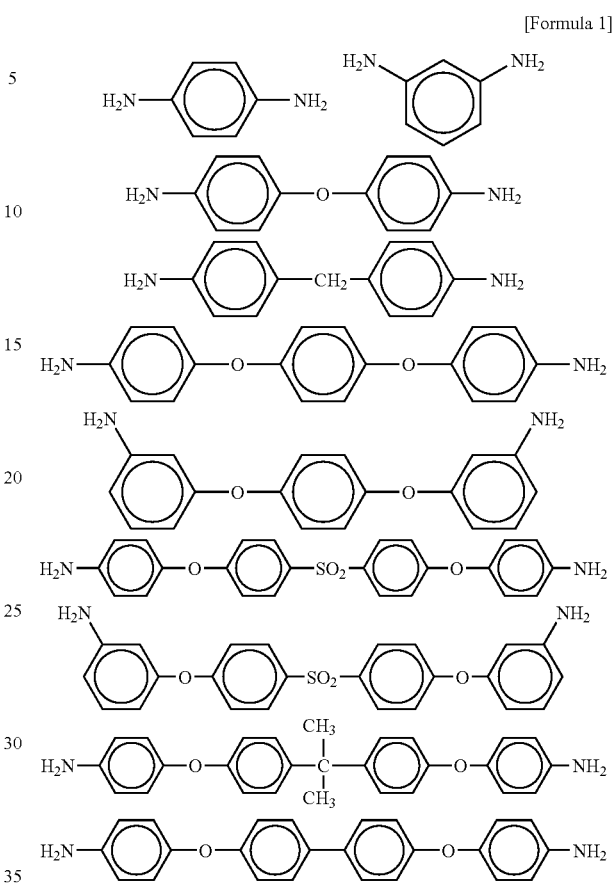

[Formula 1]

Alternatively, a vinyl derivative monomer is subjected to vapor deposition and UV radiation to be polymerized, thereby forming a thin film having good insulating properties. The following reaction is caused to occur. Here, the properties of the thin film can be adjusted by changing a substituent R in different. The substituent may be hydrogen atoms and may be necessarily the same with each other.

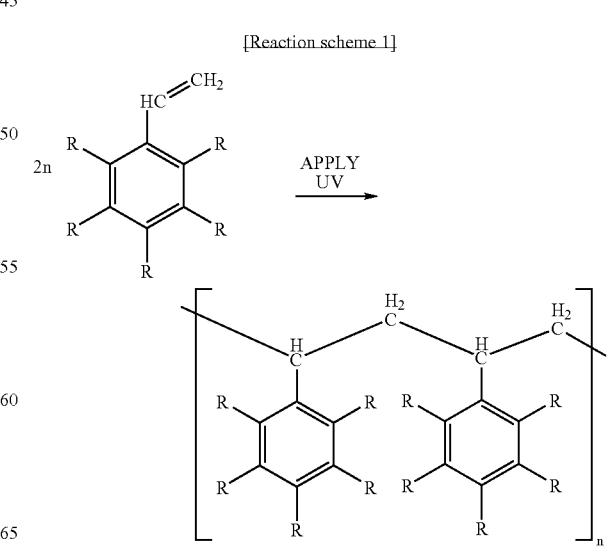

[Reaction scheme 1]

Then, an organic gate insulating layer is formed on the substrate (step 2).

Physical parameters such as the degree of vacuum in a deposition chamber, a substrate temperature, power and so on, are controlled to form an organic gate insulating layer on the substrate according to characteristics of a vapor deposition apparatus used. When a vapor deposition chamber is used, the degree of vacuum is set to $10^{-6}$ Torr or less.

An organic gate insulating layer is called as such because most of insulating layers formed in the process exist in the phase of monomolecules or oligomers rather than polymers having completely undergone polymerization.

If an aromatic tetracarboxylic dianhydride monomer source and an aromatic diamine monomer source are used, the respective sources are separately evaporated and physical parameters are controlled so that the molar ratio of monomers in the organic gate insulating layer becomes 1:1, thereby forming a film.

Finally, a polymerization reaction is caused to occur in the organic gate insulating layer, thereby completing an organic polymeric gate insulating layer (step 3).

In step 3, polymerization is caused to occur in the organic gate insulating layer formed in the phase of monomolecules or oligomers, so that the organic gate insulating layer is turned into a polymeric film. That is to say, the organic gate insulating layer is subjected to a heat treatment at 100 to 400° C. to cause thermal polymerization or to light radiation of 150 nm to 10 μm to cause photopolymerization, thereby completing a gate insulating layer made of an organic polymeric film.

The thermal polymerization is performed by using a heater in a vapor deposition apparatus to raise the temperature of a substrate, thereby in-situ performing the steps of forming the organic gate insulating layer and completing the organic polymeric gate insualting layer.

The photopolymerization is performed by installing a light radiation unit in a vapor deposition apparatus, thereby in-situ performing the steps of forming the organic gate insulating layer and completing the organic polymeric gate insualting layer.

Now, a method for fabricating a staggered-inverted organic TFT according to an embodiment of the present invention will be described with reference to FIGS. 2 and 3.

Figure 2:
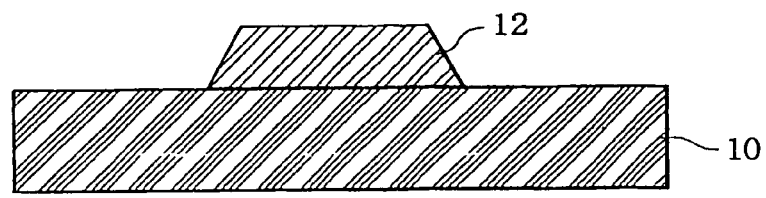
FIGS. 2 and 3 are cross-sectional views of methods for fabricating is a staggered-inverted type organic TFT (thin film transistor) according to the present invention.

FIG. 2 shows the step of forming a gate electrode 12 on a substrate 10. In detail, the substrate 10 with a shadow mask for defining a gate electrode, is disposed in a vacuum chamber for gate electrode deposition, and a metal for use as a gate electrode is placed in a metal boat. Usable gate electrode metals include aluminum having a low work function to realize a p-channel TFT. The vacuum chamber is maintained at the degree of vacuum of $5 \times 10^{-4}$ Torr or less, preferably $5 \times 10^{-7}$ Torr, and deposition is performed at a rate of 3–5 Å/sec, thereby forming the gate electrode 12. The gate electrode made of aluminum, for example, is formed to a thickness of 1700 Å.

Figure 3:
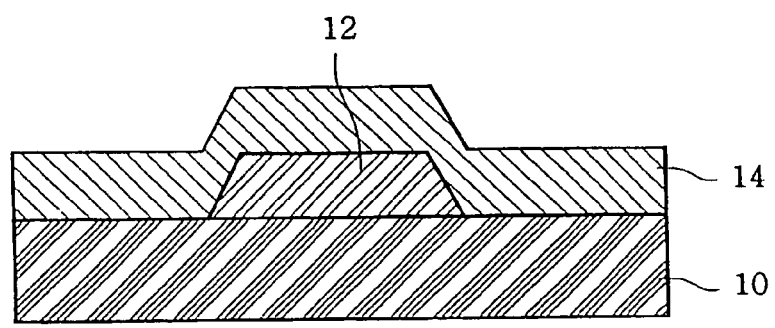

FIG. 3 shows the step of forming an organic polymeric gate insulating layer 14.

The substrate having the gate electrode 12 is placed in the vacuum deposition chamber and monomer sources for forming target organic polymeric layers are inserted into an evaporator such as a metal boat.

Subsequently, the vacuum chamber is maintained at the degree of vacuum of $10^{-6}$ Torr or less, preferably $5 \times 10^{-7}$ Torr, and deposition is performed at a rate of 5–10 Å/sec, thereby forming an organic gate insulating layer having a thickness of 50 to 20000 Å.

In the case of using an aromatic tetracarboxylic dianhydride monomer source and an aromatic diamine monomer source, deposition is performed such that the molar ratio of the respective monomers in the insulating layer is 1:1.

Then, thermal polymerization is carried out for about 30 minutes to about 2 hours by performing a heat treatment at 100 to 400° C., or photopolymerization is carried out for about 10 minutes or less by radiating light of 150 nm to 10 μm, thereby completing the organic polymeric gate insulating layer 14.

Figure 4:
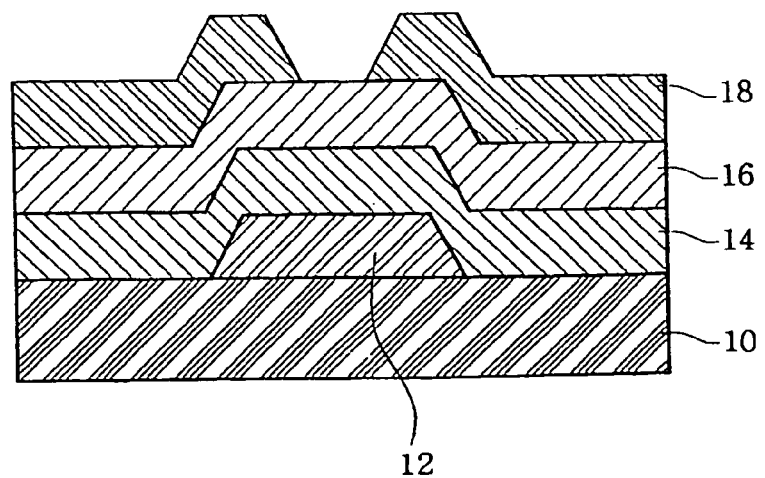
FIG. 4 shows a FT-IR (Fourier Transform Infrared Absorption) spectral result for a polyimide gate insulating layer according to the present invention.

The organic gate insulating layer is formed to a thickness of approximately 1500 Å using 4,4'-oxydiphthalic dianhydride and 4,4'-oxydianiline as an aromatic tetracarboxylic dianhydride monomer source and an aromatic diamine monomer source, respectively. Then, the organic gate insulating layer is copolymerized in a vacuum oven at approximately 220° C. for about 1 hour. FIG. 4 shows a FT-IR (Fourier Transform Infrared Absorption) spectral result for the obtained organic polymeric gate insulating layer according to the present invention. In FIG. 4, peaks are observed around 1379 cm$^{-1}$ (C—N), 1500 cm$^{-1}$ (C—C), 1720 cm$^{-1}$ (C═O, asymmetric), 1778 cm$^{-1}$ (C═O, symmetric), from which the finally obtained organic polymeric gate insulating layer is identified as a polyimide layer.

Figure 5:
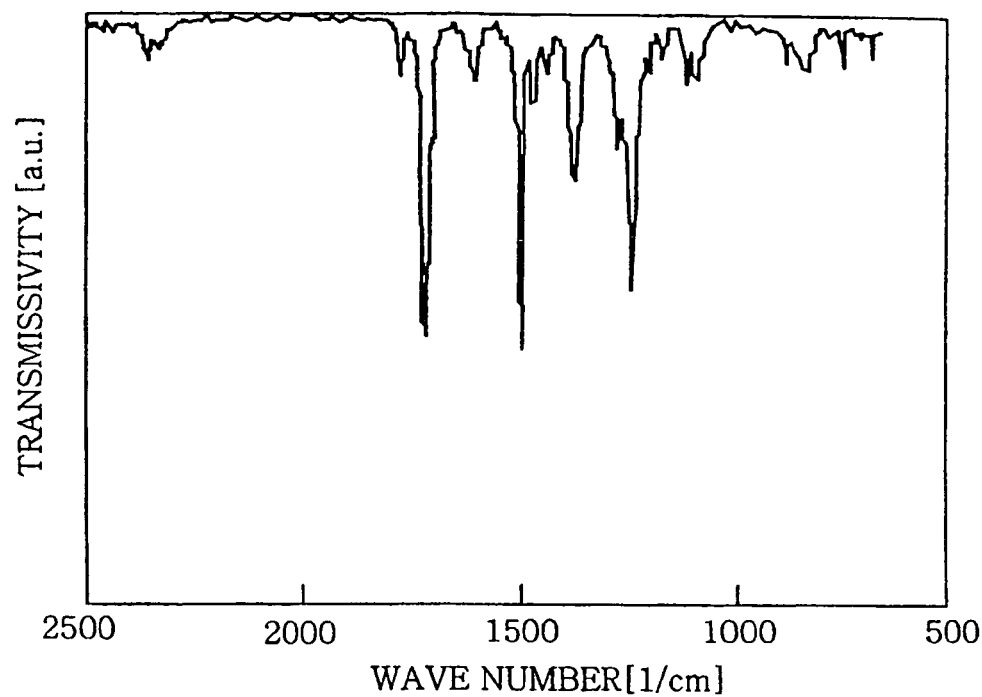
FIG. 5 is a graphic representation of the current-to-voltage relationship of the polyimide gate insulating layer according to the present invention.

Also, it is confirmed that the resulting device consisting of the aluminum gate (1700 Å) and polyimide gate insualting layer (1500 Å) has an electrical conductivity of approximately $10^{-11}$ S/cm and a breakdown current field of approximately 0.3 MV/cm, as shown in FIG. 5, which are suitable characteristics so as to serve as a gate insulating layer.

Figure 6:
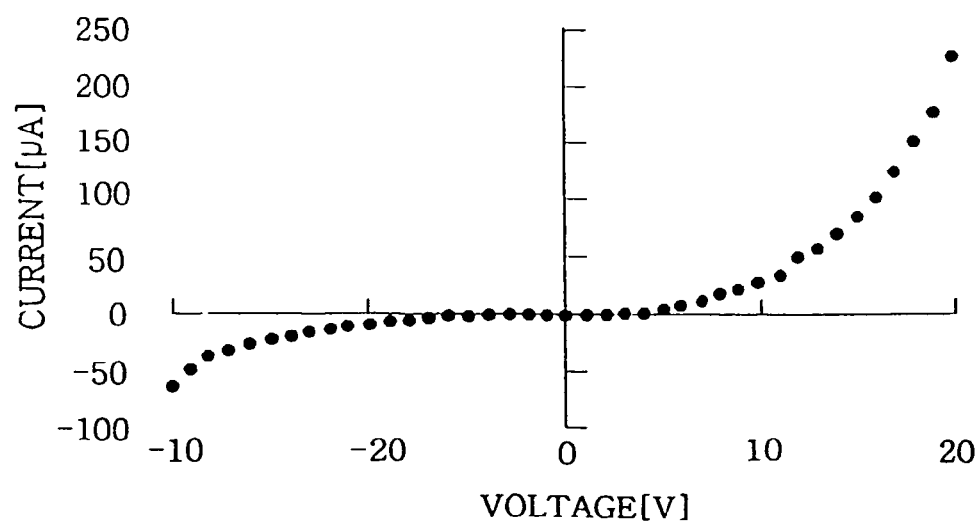
FIG. 6 is a cross-sectional view of a staggered-inverted type organic TFT according to the present invention.

Then, subsequent processes are carried out on the substrate having the completed organic polymeric gate insulating layer 14, thereby completing a staggered-inverted type organic TFT, as shown in FIG. 6.

In detail, an organic semiconductor active layer 16 is formed on the organic polymeric gate insulating, layer 14 by a vapor deposition method, preferably a thermal evaporation method. The organic semiconductor active layer 16 is formed of an organic semiconductor material, such as pentacene, oligo-thiophene, poly(alkylthiophene) or poly(thienylenevinylene). The degree of vacuum in the vacuum deposition chamber is set to $5 \times 10^{-4}$ Torr or less, preferably $5 \times 10^{-7}$ Torr, and deposition is performed at a rate of approximately 0.5 Å/sec, thereby forming the organic semiconductor active layer 16 having a thickness of approximately 1000 Å.

Then, the substrate 10 is overlaid with a shadow mask for source/drain electrode and a metal material having a high work function is deposited by vacuum deposition, thereby forming a source/drain electrode 18. Here, gold is suitably used as the metal material. The degree of vacuum in the vacuum deposition chamber is set to $5 \times 10^{-4}$ Torr or less, preferably $5 \times 10^{-7}$ Torr, and deposition is performed at a rate of approximately 3–5 Å/sec, thereby forming the source/drain electrode 18 having a thickness of approximately 1500 Å.

Figure 7:
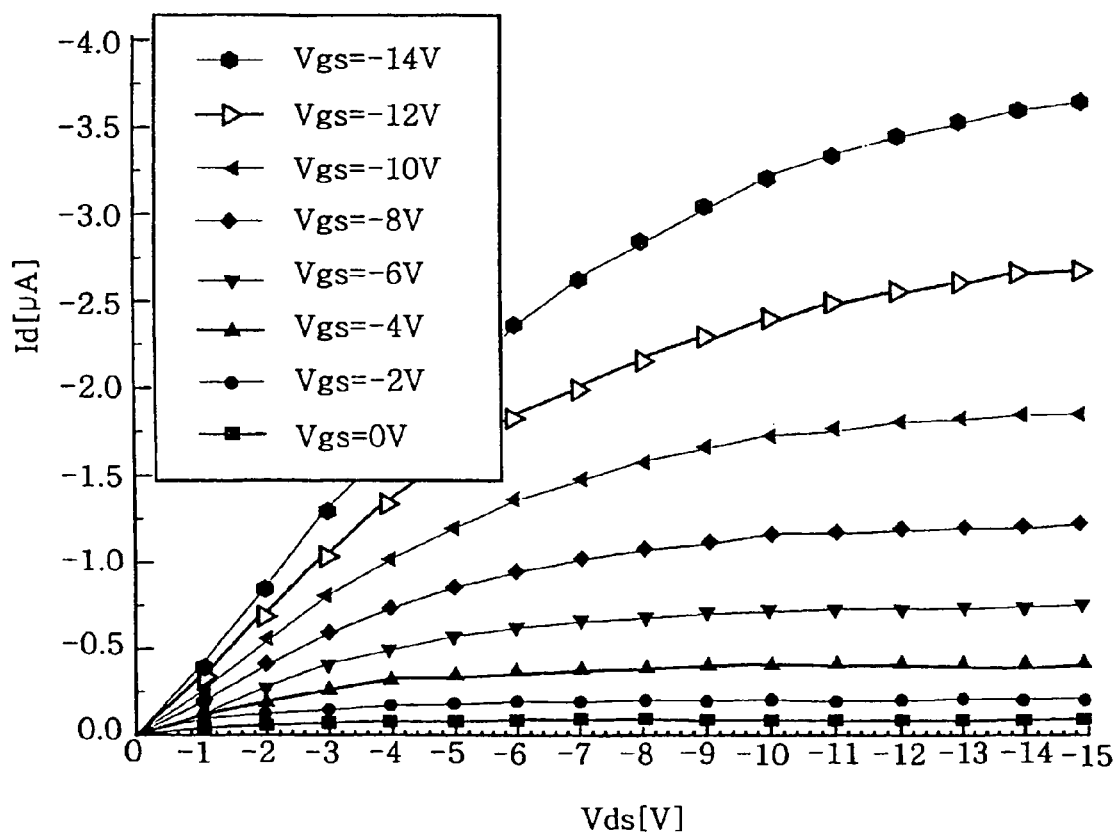
FIG. 7 is a graphic representation of the current-to-voltage relationship of the staggered-inverted type organic TFT shown in FIG. 6.
Figure 1:
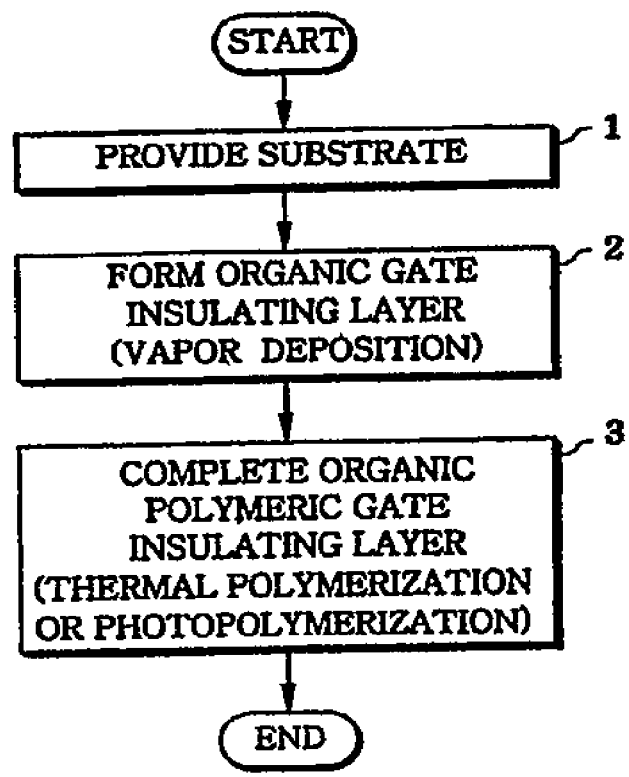
Figure 2:
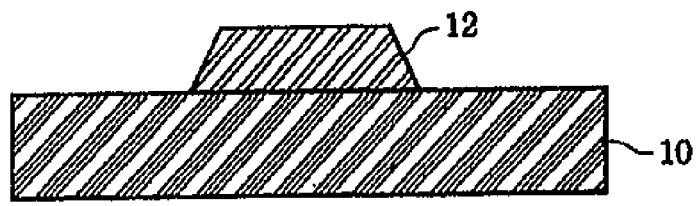
Figure 3:
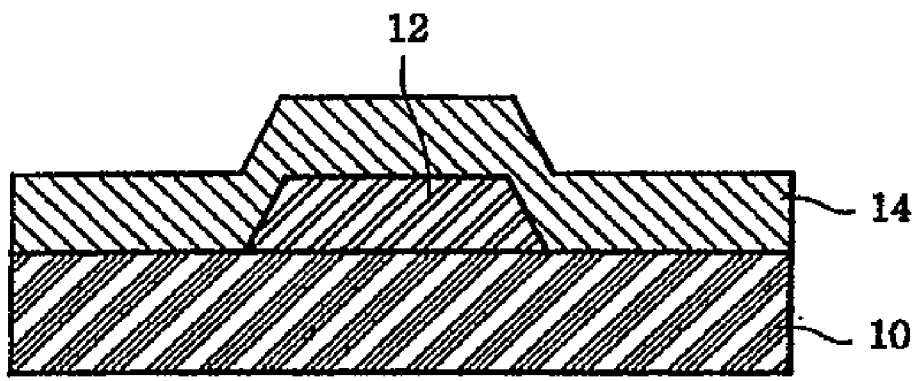
Figure 4:
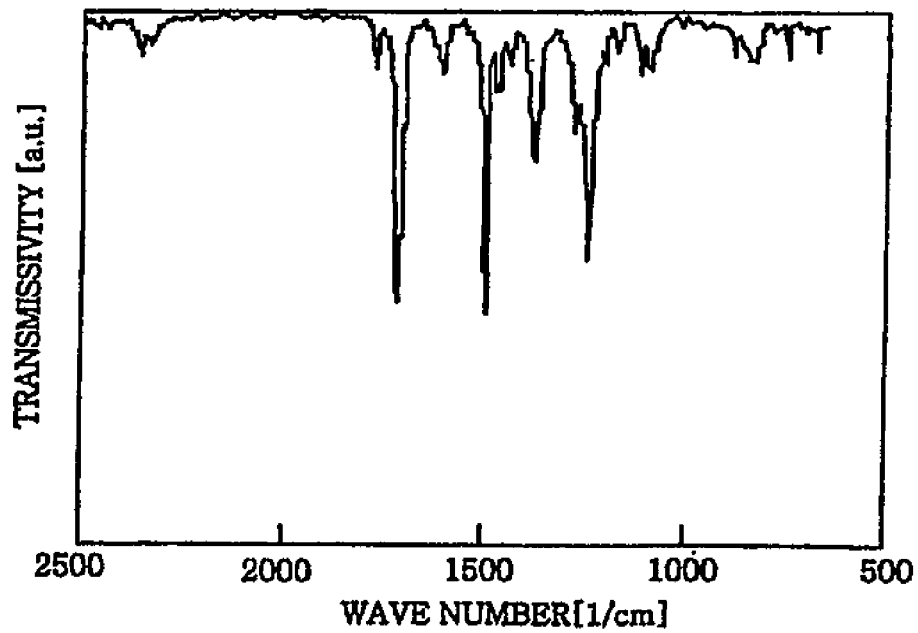
Figure 5:
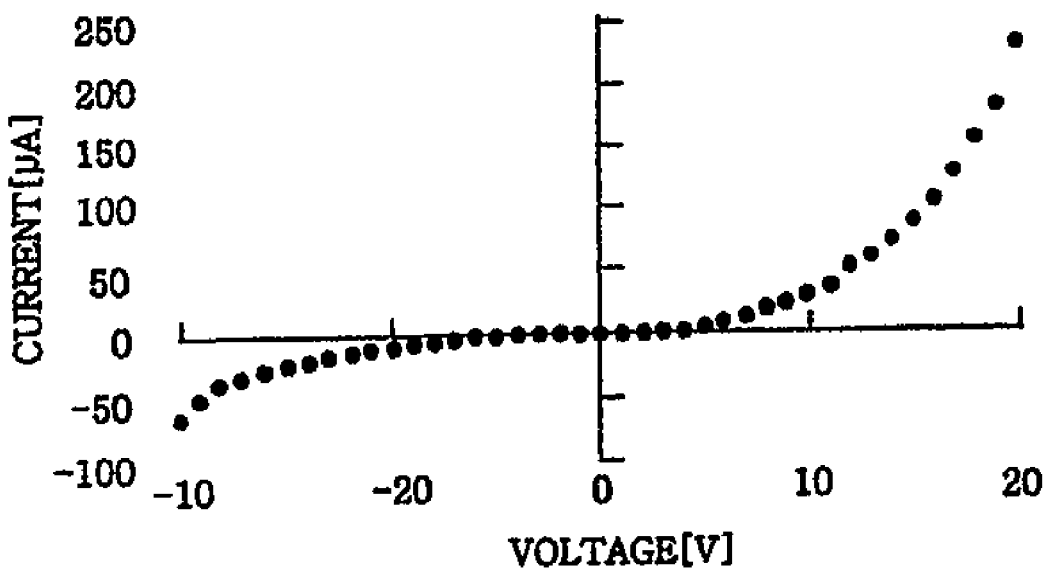
Figure 6:
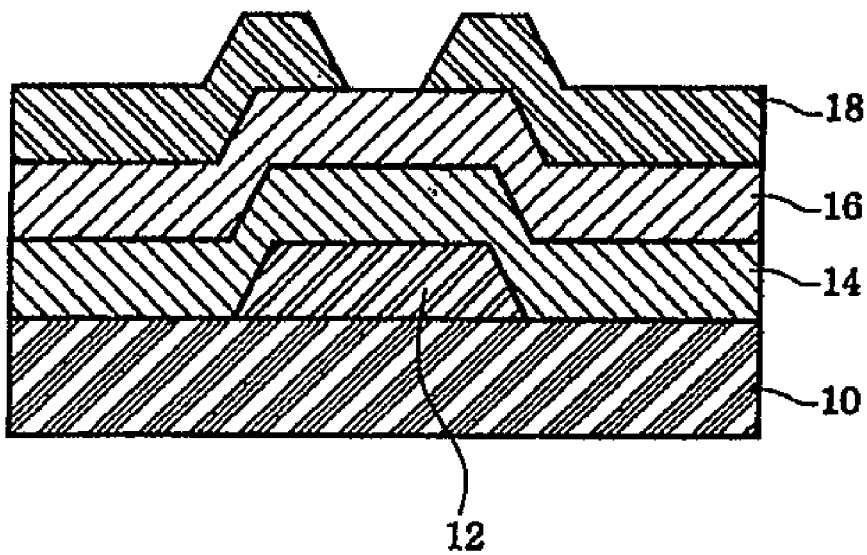
Figure 7:
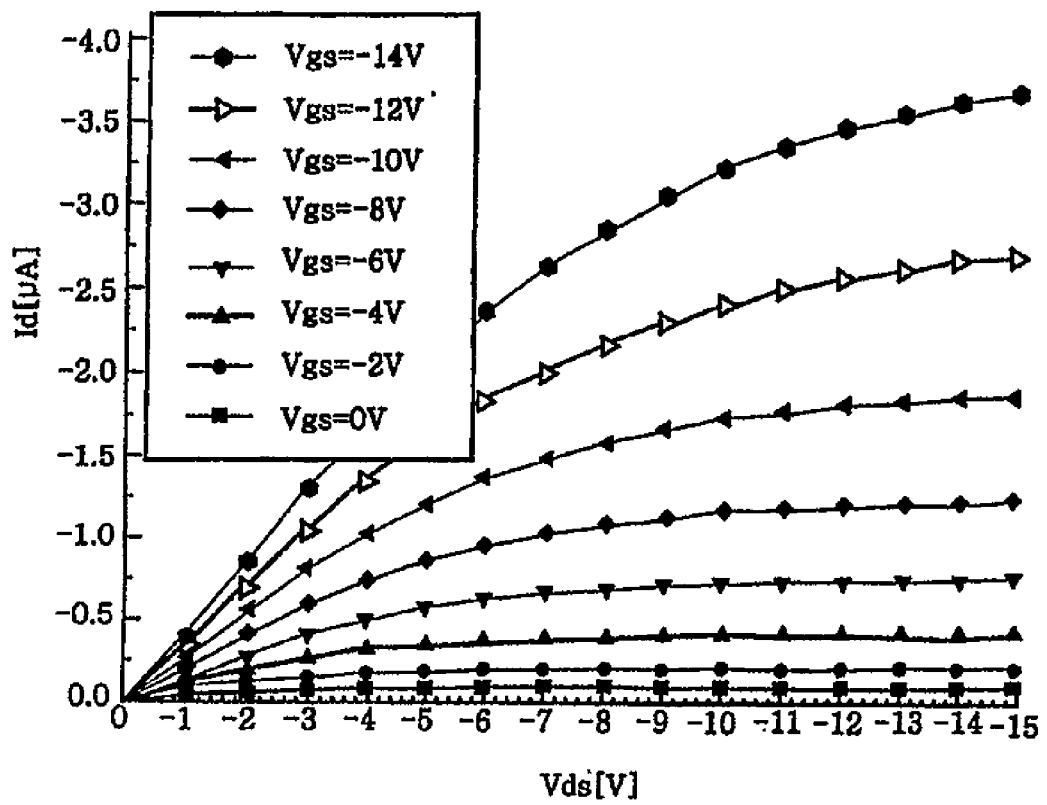

FIG. 7 shows the output characteristics of the organic TFT comprised of aluminum gate (1700 Å), polyimide gate insulating layer (1500 Å), pentacene active layer (1000 Å) and gold source/drain electrode (1500 Å). In FIG. 7, Id, Vds, and Vgs are drain current, drain-to-source voltage, gate-to-source voltage, respectively. Referring to FIG. 7, the field-effect mobility of the organic TFT is approximately 0.1 cm$^2$/V·s, which is quite a good level.

Although a method for fabricating a staggerd-inverted type TFT has been described above in a preferred embodiment of the present invention, the method of the present invention can also be applied to fabrication of a staggered type organic TFT having a structure in which an active layer, a source/drain electrode, a gate insulating layer and a gate electrode are sequentially stacked. In this case, the respective steps of the fabrication method are in-situ performed. Further, the method for fabricating an organic polymeric gate insulating layer according to the present invention can also be applied to a general fabrication method of an organic field-effect transistor.

INDUSTRIAL APPLICABILITY

As described above, in the method for fabricating an organic semiconductor transistor according to the present invention, a gate insulating layer is formed of an organic polymeric layer that can be formed at low temperature. Since the organic polymeric gate insulating layer is formed using a vapor deposition method, which is a low-temperature dry-type technique, it does not affect pre-process layers. Thus, pre-process layers can be freely selected and various organic semiconductor transistors can be designed. Also, since the organic gate insulating layer formation can be in-situ performed with respect to active layer formation, and can be in-situ performed with respect to gate electrode formation and source/drain electrode formation, the present invention has a significant advantage in terms of simplicity of the fabrication process and equipment. Therefore, organic semiconductor transistors suited to many applications can be easily fabricated at low cost. Further, since the fabrication method according to the present invention employs vapor deposition, a gate insulating layer having good properties can be formed with a high level of uniformity, thereby making it easy to fabricate a transistor on a large-area substrate.

What is claimed is:

1. A method for fabricating an organic semiconductor transistor comprising the steps of:
    providing a substrate;
    forming an organic gate insulating layer on the substrate by a vapor deposition method using organic monomer sources; and
    causing a polymerization reaction to occur in the organic gate insulating layer to complete an organic polymeric gate insulating layer,
    wherein the polymerization reaction is photo-polymerization by light radiation of 150 nm to 10 μm.

2. The method according to claim 1, wherein the organic gate insulating layer is formed to a thickness of 50 to 20000 Å.

3. The method according to claim 1, wherein the vapor deposition method is a vacuum deposition method.

4. The method according to claim 1, wherein the steps of forming the organic gate insulating layer and completing the organic polymeric gate insulating layer using the photo-polymerization are in-situ performed.

5. The method according to claim 1, further comprising the step of forming an organic semiconductor active layer on the organic polymeric insulating layer, after the step of completing the organic polymeric insulating layer.

6. The method according to claim 5, wherein the steps of forming the organic gate insulating layer, completing the organic polymeric gate insulating layer and forming an organic semiconductor active layer on the organic polymeric insulating layer are in-situ performed.

7. The method according to claim 1, wherein in step of providing a substrate, an organic semiconductor active layer and a source/drain electrode are formed on the substrate.

8. The method according to claim 7, wherein the organic semiconductor active layer and the source/drain electrode are formed by the step in-situ performed with respect to the steps of forming the organic gate insulating layer and completing the organic polymeric gate insulating layer.

9. The method according to claim 1, wherein the organic monomer source includes an aromatic tetracarboxylic dianhydride monomer and an aromatic diamine monomer, and the organic polymeric gate insulating layer is a gate insulating layer.

10. The method according to claim 9, wherein the step of forming the organic gate insulating layer includes separately evaporating the aromatic tetracarboxylic dianhydride monomer and the aromatic diamine monomer so that the molar ratio of the respective monomers in the organic gate insulating layer becomes 1:1, and completing the organic polymeric gate insulating layer includes subjecting the organic gate insulating layer to photopolymerization by radiating light radiation of 150 nm to 10 μm to yield a polyimide gate insulating layer.

11. The method according to claim 1, wherein the substrate is a heat-resistant plastic substrate.

12. The method according to claim 1, wherein the steps of forming the source/drain electrode and the gate electrode of the organic semiconductor transistor are in-situ performed with respect to the steps of forming the organic gate insulating layer and completing the organic polymeric gate insulating layer.

* * * * *

UNITED STATES PATENT AND TRADEMARK OFFICE
CERTIFICATE OF CORRECTION

| | | |
|---|---|---|
| PATENT NO. | : 7,056,838 B2 | |
| APPLICATION NO. | : 11/197090 | |
| DATED | : June 6, 2006 | |
| INVENTOR(S) | : Jae Hoon Shim et al. | |

It is certified that error appears in the above-identified patent and that said Letters Patent is hereby corrected as shown below:

IN THE FIGURES:
Delete the figures and substitute attached Figures 1-7 as shown on the attached pages.

Column 2,
Line 37, after "gate", delete "insualting" and insert therefor --insulating--.
Line 66, after "fabricating", delete "is".

Column 5,
Line 35, after "gate", delete "insualting" and insert therefor --insulating--.
Line 40, after "gate", delete "insualting" and insert therefor --insulating--.

Column 6,
Line 26, after "gate", delete "insualting" and insert therefor --insulating--.
Lines 31-32, after "sub-strate", insert --10--.
Line 36, after "insulating", delete ",".

Signed and Sealed this

Twenty-sixth Day of December, 2006

JON W. DUDAS
*Director of the United States Patent and Trademark Office*